US006853156B2

(12) United States Patent
Chang

(10) Patent No.: US 6,853,156 B2
(45) Date of Patent: Feb. 8, 2005

(54) PIEZOELECTRIC CERAMIC LIGHT STARTER

(75) Inventor: Ching-Chung Chang, Taipei (TW)

(73) Assignee: Lite-On Technology Corporation, Taipei (TW)

( * ) Notice: Subject to any disclaimer, the term of this patent is extended or adjusted under 35 U.S.C. 154(b) by 0 days.

(21) Appl. No.: 10/461,502

(22) Filed: Jun. 16, 2003

(65) Prior Publication Data

US 2004/0251850 A1 Dec. 16, 2004

(51) Int. Cl.[7] .......................... G05F 1/00; H01L 41/06; H02M 7/00

(52) U.S. Cl. ...................... 315/291; 315/307; 315/274; 310/316; 310/319; 363/123; 363/124

(58) Field of Search ................................ 315/291, 307, 315/274, 276, 282; 310/314–319; 363/123, 124, 134, 97

(56) References Cited

U.S. PATENT DOCUMENTS 6,229,720 B1 * 5/2001 Noma et al. .................. 363/40
2003/0160574 A1 * 8/2003 Gray .......................... 315/291

* cited by examiner

*Primary Examiner*—Tuyet Thi Vo
(74) *Attorney, Agent, or Firm*—Birch, Stewart, Kolasch & Birch, LLP

(57) ABSTRACT

A piezoelectric ceramic light starter, which includes a power switch, a piezoelectric transformer, and a frequency tracking unit, is disclosed. The power switch connected to a pulse width modulated (PWM) harmonic signal output terminal closes when the PWM harmonic signal is in its positive period, and opens when which signal is in negative period. The piezoelectric transformer has the input terminal of its first-level coil connected to the power switch. The output terminal of the first-level coil generates a high-frequency AC signal to drive a cold cathode fluorescent light (CCFL). The frequency tracking unit is coupled to the output terminal of the CCFL. When the light starter starts, a first frequency is obtained when the CCFL is lighted and a second frequency is obtained when the CCFL is turned off. The PWM harmonic signal uses the average of the first frequency and the second frequency as the basis for output.

8 Claims, 3 Drawing Sheets

PIEZOELECTRIC CERAMIC LIGHT STARTER

BACKGROUND OF THE INVENTION

1. Field of Invention

The invention relates to a light starter and, in particular, to a light starter using piezoelectric ceramics as its transformer to drive a cold cathode fluorescent light (CCFL).

2. Related Art

The CCFL has wide applications, such as backlit sources of liquid crystal displays, scanners, multiple function peripherals (MFP's), etc. Other devices such as transparent media adaptors (TMA's), scanning of negative films or XPA's also use the CCFL as their light sources.

Since the CCFL requires an extremely high voltage (hundreds of volts) during initialization and work, its driver or light starter has to be able to provide such high-voltage power output. The output power quality of the driver determines the brightness and stability of the CCFL.

Normally, the CCFL is driven by a transformer. The transformer is an electronic oscillatory circuit with two or more sets of coils. Inductance happens via air or iron cores between the coils to produce coupled signals. According to the electromagnetic inductance rule, the electric voltage is raised or lowered to drive the CCFL. The electronic oscillatory circuit is limited by the physical material properties of the coiled transformer so that the voltage conversion efficiency is worse. The voltage conversion loss is thus higher.

Although the traditional copper-wire-iron-core transformers are very popular and there exists a more mature technology, there are still some drawbacks in practical uses. For example, it is possible for them to be on fire and smoky when the temperature is high or the power supply is not stable. On the other hand, using electromagnetic coils is likely to produce electromagnetic interference (EMI). Moreover, the volume of the traditional transformers tends to be larger.

In summary, the coiled transformer and the PWM circuit determines the light output conversion efficiency and whether the driver circuit is stable. If the CCFL initialization time can be greatly reduced and the conversion efficiency of the coiled transformer can be increased, the brightness of the CCFL can be more stable while its lifetime is longer.

SUMMARY OF THE INVENTION

In view of the foregoing, it is an objective of the invention to provide a piezoelectric light starter to solve existing problems in conventional transformers.

To achieve the above objective, the disclosed piezoelectric ceramic light starter has a power switch, a piezoelectric transformer, and a frequency tracking unit. The power switch connects to a pulse width modulated (PWM) harmonic signal output terminal in order to close when the PWM harmonic signal is in its positive period and to open when the PWM harmonic signal is in its negative period. The piezoelectric transformer has the input terminal of its first-level coil connected to the power switch. The output terminal of the first-level coil generates a high-frequency AC signal to drive a CCFL. The frequency tracking unit is coupled to the output terminal of the CCFL. When the light starter starts, a first frequency is obtained when the CCFL is lighted and a second frequency is obtained when the CCFL is turned off. The PWM harmonic signal uses the average of the first frequency and the second frequency as the basis for output.

In comparison with traditional transformers, the disclosed piezoelectric ceramic light starter is smaller to suit the trend of minimizing electronic devices. Since no transformer is required, there will be no EMI or the problem of being smoky if the coil is short-circuited. Moreover, it has the advantages of being highly efficient, power-saving, and long-lifetime.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

The piezoelectric ceramics are piezoelectric materials made of ceramics, such as BaTiO3 and PZT. Although piezoelectric ceramics have the powdering effect, it is negligible in comparison with the product lifetime. This is because the piezoelectric ceramics lifetime is longer than the CCFL. In other words, even when the CCFL reaches its lifetime, the piezoelectric ceramics still will no become powders. Thus, this drawback can be ignored.

In order for the CCFL to stably emit light, the circuit design has to have a higher conversion efficiency. Therefore, using a piezoelectric transformer with a better conversion efficiency is a device to be considered.

In an embodiment of the invention, the application specific integrated circuit (ASIC) in a scanner has the self-calibration function. The ASIC scans and locks the resonance frequency of a piezoelectric ceramic transformer, so that the transformer performs the self-scan each time it starts. A stable frequency is output to drive the light, elongating the lifetime of the light.

Figure 1:
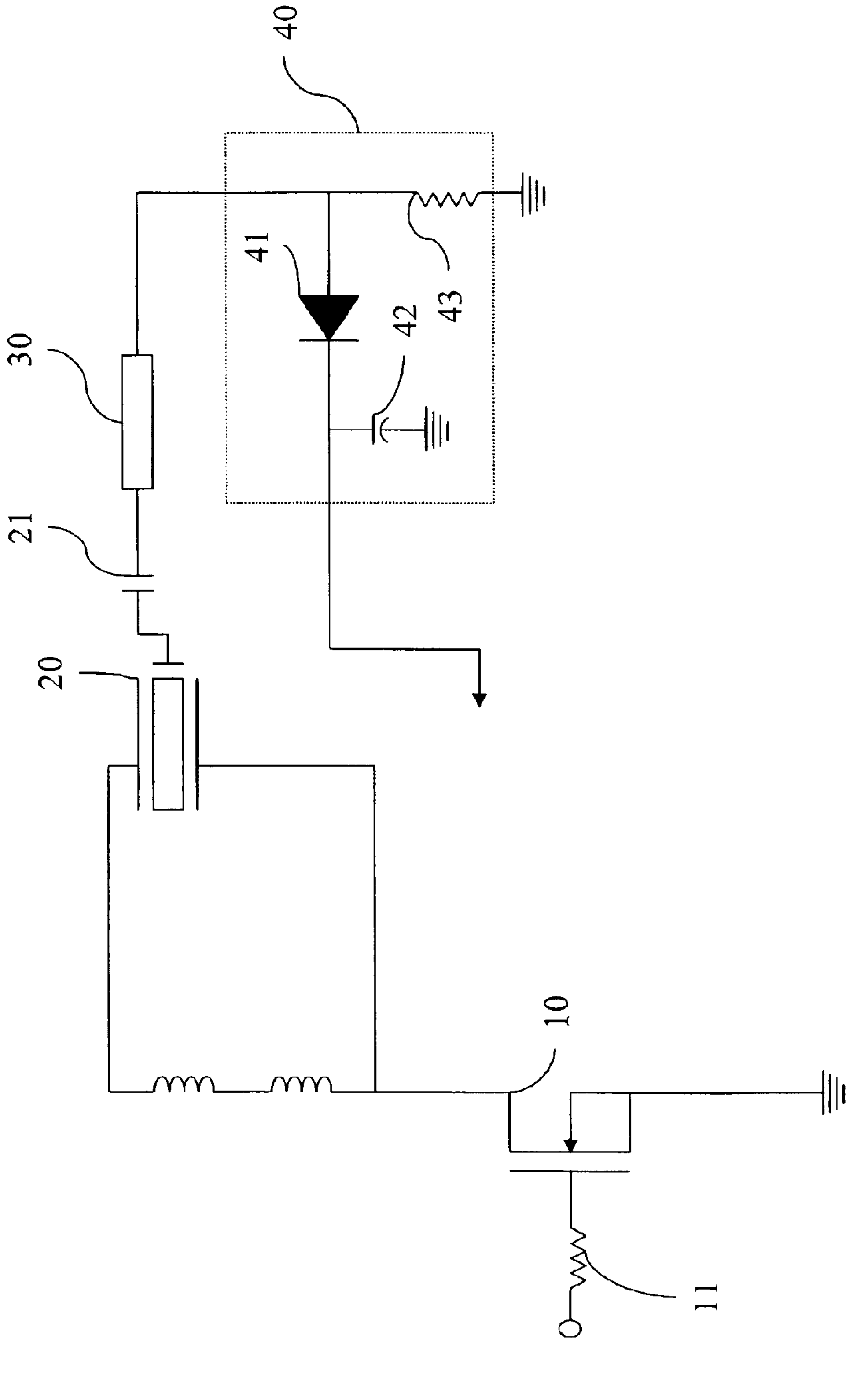
FIG. 1 is a circuit of the disclosed piezoelectric ceramic light starter.

In a preferred embodiment of the invention, the piezoelectric ceramic light starter has a power switch 10, a piezoelectric transformer 20, and a frequency tracking unit 40 to convert the power into a high-voltage power to light up the CCFL 30 (see FIG. 1). In the current embodiment, we use a CCFL 30 as an example.

The power switch can use a MOSFET, which is a three-pin switch device with a gate, a drain and a source. The gate is connected to the output terminal of the PWM harmonic signal. The drain is connected to the first-level coil input terminal of the piezoelectric transformer. The source is connected to the ground. The gate and the output terminal of the PWM harmonic signal is further connected with a resistor 11 for restricting the electric current, thereby protecting the MOSFET.

The traditional transformers use a high-frequency oscillator to generate high-frequency AC waves. Such a high-frequency oscillator is comprised of crystal oscillators, Kepler oscillators, and RC phase-shift oscillators. However, the invention does not need a high-frequency oscillator to generate such waves. Instead, it uses an ASIC that can output PWM harmonic signals as the source of oscillation frequencies. Products using such ASIC include scanners. The scanners have the trend of becoming light, compact, and cheap in price. Therefore, the space and cost of the components have to be seriously considered. The disclosed piezoelectric transformer can simultaneously solve these two problems.

When the wave of the PWM harmonic signal generated by the output terminal is in its positive period, the power switch 10 turns on. The current flows from the drain to the first-level coil of the piezoelectric transformer 20. After the voltage conversion of the piezoelectric transformer 20, a high voltage in its positive period is obtained at the output terminal. When the PWM harmonic signal is in its negative period, the power switch 10 turns off. Using this method, the PWM harmonic signal can turn on and off the power switch 10, supplying the current to the piezoelectric transformer 20 alternately. An alternate high voltage is thus generated to light up he CCFL 30 at the output terminal of the piezoelectric transformer 20.

A capacitor 21 is connected between the output terminal of the piezoelectric transformer 20 and the CCFL 40 as a filter.

However, the resonance frequency of each piezoelectric ceramics is distinct. In order to prevent such frequency instability property from affecting the power quality and CCFL lifetime, the output terminal of the CCFL 30 is coupled with a frequency tracking unit 40. The frequency tracking unit 40 is made of a diode 41 and a capacitor 42. The positive pole of the capacitor 42 is connected to the negative pole of the diode 41. The negative pole of the capacitor 42 is connected to the ground. A resistor 43 is connected between the positive pole of the diode 41 and the ground to limit the current for protecting the frequency tracing unit 40.

Taking the preferred embodiment as an example, the system starts the scanning from 58 kHz each time it is turned on. The scanning is performed by increasing the frequency by 0.1 kHz each time until the light is turned on. The frequency at this moment is set as the frequency. A second frequency is obtained after the light is turned off. Finally, the average of the first and second frequencies is computed to be the output basis of the PWM harmonic signal. This computation is done by a conventional computer or circuit.

Figure 2:
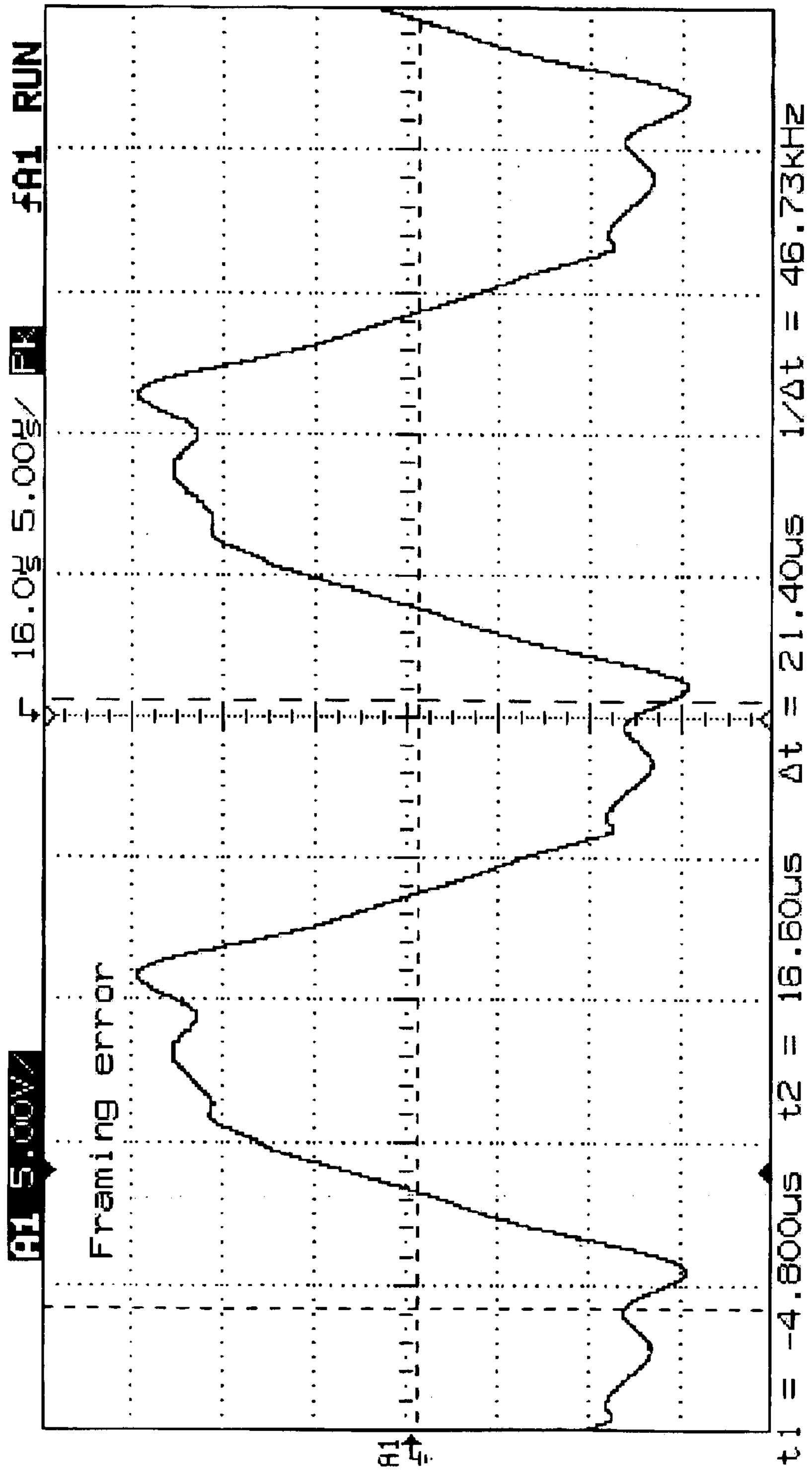
FIG. 2 is the output voltage waveform of a conventional transformer.
Figure 3:
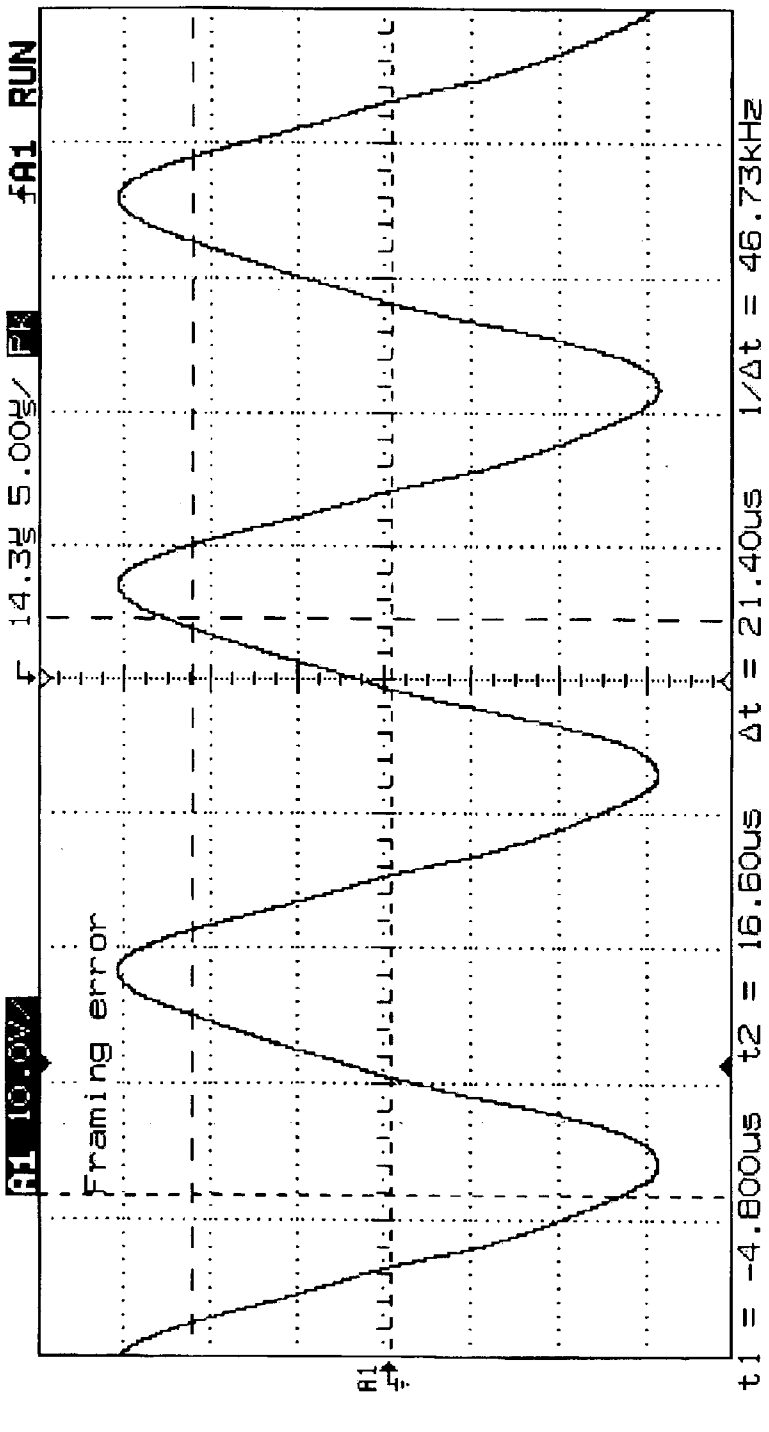
FIG. 3 is the output voltage waveform of the disclosed piezoelectric ceramic light starter.

The power waveform output from the disclosed piezoelectric ceramic transformer is better than the prior art. As seen in FIG. 2, part of the peak and trough of the output voltage wave has loss, resulting in an imperfect waveform. The output waveform of the invention is shown in FIG. 3. It is seen that the peaks and troughs are fairly good. This proves that the disclosed piezoelectric ceramic transformer has a better voltage conversion efficiency than the prior art. The traditional voltage mainly uses coils as its voltage conversion elements; while the invention uses piezoelectric ceramics instead. In addition to coils, the conventional transformers also use resistors, transistors, and capacitors. The disclosed piezoelectric ceramic transformer uses fewer elements, with a cost much less than the traditional transformer but a better electric energy conversion efficiency. Moreover, the invention has he advantage of minimizing the volume and increasing the electric power density.

Certain variations would be apparent to those skilled in the art, which variations are considered within the spirit and scope of the claimed invention.

What is claimed is:

1. A piezoelectric ceramic light starter comprising:

a power switch, which is connected to a pulse width modulated (PWM) harmonic signal output terminal, and turns on during the positive period of the PWM harmonic signal and off during the negative period;

a piezoelectric transformer, which has an input terminal for its first-level coil is connected to the power switch and generates a high-frequency AC signal at its output terminal to drive a cold cathode fluorescent light (CCFL); and a frequency tracking unit, which is coupled to the output terminal of the CCFL to obtain a first frequency when the starter lights up the CCFL and a second frequency when the CCFL is turned off, wherein the average of the first frequency and the second frequency is used as the output basis for the PWM harmonic signal.

2. The piezoelectric ceramic light starter of claim 1, wherein the PWM harmonic signal comes from an application specific integrated circuit (ASIC).

3. The piezoelectric ceramic light starter of claim 1, wherein the power switch is a metal oxide semiconductor field effect transistor (MOSFET).

4. The piezoelectric ceramic light starter of claim 1, wherein a capacitor is connected between the output terminal of the piezoelectric transformer and the CCFL as a filter.

5. The piezoelectric ceramic light starter of claim 1, wherein a resistor is connected between the power switch and the output terminal of the PWM harmonic signal to restrict the electric current for protecting the power switch.

6. The piezoelectric ceramic light starter of claim 5, wherein the gate of the MOSFET is connected to the output terminal of the PWM harmonic signal, its drain is connected to the input terminal of the first-level coil of the piezoelectric transformer, and its source is connected to the ground.

7. The piezoelectric ceramic light starter of claim 1, wherein the frequency tracing unit is comprised of a diode and a capacitor, the positive pole of the capacitor connecting to the negative pole of the diode and the negative pole of the capacitor to the ground.

8. The piezoelectric ceramic light starter of claim 7, wherein a resistor is connected between the positive pole of the diode and the ground to limit the electric current for protecting the frequency tracing unit.

* * * * *

UNITED STATES PATENT AND TRADEMARK OFFICE

CERTIFICATE OF CORRECTION

PATENT NO. : 6,853,156 B2
APPLICATION NO. : 10/461502
DATED : February 8, 2005
INVENTOR(S) : Ching-Chung Chang It is certified that error appears in the above-identified patent and that said Letters Patent is hereby corrected as shown below:

Title page Item [30] should read
Foreign Application Priority Data: February 18, 2003 (TW) 92202521

Signed and Sealed this

Twenty-second Day of September, 2009

David J. Kappos

David J. Kappos
*Director of the United States Patent and Trademark Office*